United States Patent [19]

Whitby

[11] Patent Number: 4,524,846

[45] Date of Patent: Jun. 25, 1985

[54] LOUDSPEAKER SYSTEM

[76] Inventor: Ronney J. Whitby, 8067 Center Pkwy., Sacramento, Calif. 95823

[21] Appl. No.: 471,495

[22] Filed: Mar. 2, 1983

[51] Int. Cl.[3] .............. H05K 5/00

[52] U.S. Cl. .............. 181/152; 181/147; 181/159; 181/156

[58] Field of Search .............. 181/144, 145, 152, 159, 181/146, 182, 183, 187, 192, 160, 194, DIG. 1, 156

[56] References Cited

U.S. PATENT DOCUMENTS

| | | | |
|---|---|---|---|
| 2,808,121 | 10/1957 | Goettner | 181/31 |
| 2,975,852 | 1/1958 | Chaue | 181/155 |
| 3,729,061 | 4/1973 | Tamura | 181/31 B |
| 3,982,607 | 9/1976 | Evans | 181/DIG. 1 |
| 4,119,799 | 10/1978 | Merlino | 179/1 E |
| 4,138,594 | 2/1979 | Klipsch | 179/1 E |
| 4,139,734 | 2/1979 | Fincham | 181/145 |
| 4,325,454 | 4/1982 | Humphrey | 181/145 |
| 4,391,346 | 7/1983 | Murakami et al. | 181/147 |

FOREIGN PATENT DOCUMENTS

| | | | |
|---|---|---|---|
| 796407 | 10/1935 | France | 181/152 |

*Primary Examiner*—L. T. Hix
*Assistant Examiner*—Brian W. Brown
*Attorney, Agent, or Firm*—Leonard Bloom

[57] ABSTRACT

A loudspeaker system has an elliptical stepped mid-range horn above and coplanar with a flared mid-bass horn having disposed therein a pair of tweeters on side-walls thereof and a woofer in a backwall thereof. The back of the woofer communicates with a folded low frequency bass horn such that low frequency response is loaded from the rear of the diaphram for the woofer driver, thereby eliminating the necessity for further amplification and drivers to obtain fidelity in low frequency response. The low frequency bass section defines a convoluted path for the sound which comes from the interior structure of a folded horn thus creating an acoustical boost for low frequency sound.

15 Claims, 4 Drawing Figures

LOUDSPEAKER SYSTEM

BACKGROUND OF THE INVENTION

The instant application relates generally to the field of loudspeaker system, and more specifically to a system of horns that are more efficient and matched one to another due to the placement of the components and the configuration of the horns themselves.

The great proliferation of electronic recording and reproduction equipment in the past two decades has led to a variety of theories concerning sound reproduction and an attendant plethora of speaker configurations to reflect theories concerning greater fidelity. Today, speaker enclosures are available in all shapes and sizes, each claiming advantages over the other. Since accurate sound reproduction must cover a range of frequencies from a high frequency to a low frequency, a good loudspeaker system is usually constructed from a number of components ranging from tweeters to mid-range to mid-bass to bass components. It is often the case that a speaker system will sound particularly bright or lively through certain frequency ranges but sound flat or dead in other frequency ranges. Therefore, a speaker system must have its components tuned or matched to one another in order to effect smooth transitions between components as frequency ranges change.

More specifically, a loudspeaker system, especially those used in the commercial presentation of live music, often emphasizes the heavy lower bass frequencies at the expense of the response of the entire system. This requires heavy, lower efficiency speaker cones which slow down the response dynamics of the speaker and require much more amplification. Therefore, this mode of presentation does not balance well with the higher frequency speakers in the system. Many designs have been tried in an attempt to overcome this problem, however, the end result is always a compromise and the prior art problems remain.

A further problem involved in the bass response of public address and loudspeaker systems is the acoustical impedance seen by the driven diaphram in a front loaded horn with a rear enclosure which creates a compression chamber that effects the motion of the diaphram in certain modes of response.

These two prior art problems are addressed and solved in the device according to the instant application by providing a woofer with a front loaded horn and a rear loaded folded horn which is responsive to lower frequencies so that the diaphram motion is in linear phase alignment, which can be defined as a balance between the positive impedance encountered by the front loading and the negative impedance encountered by the rear loading of the diaphram. Furthermore, the lower limits of the front loaded horn are equal to the upper limits of the low bass horn which accesses the rear side of the diaphram. Thus, one acoustic driver drives both the mid-bass horn and the folded low bass horn, thereby eliminating the problems encountered in prior art devices such as non-linearity and non-compatibility. Furthermore, the close coupling of the mid-bass horn mouths enhance the overall function of the lower frequency range of components of the speaker system.

The reproduction of mid-range frequency sound also presents a series of unique problems. Most notable is the bell resonance effect so common to traditional mid-range speaker horns, such as those often seen in public address systems. Often the horn itself will resonate with a single frequency thus producing an interference tone, due to a harmonic response by the horn to the single frequency. Furthermore, there is often a problem in high efficiency sound dispersion with the molded contiguous surfaces associated with the conventional horn driven by a mid-range driver. These problems are solved in the instant application by the provision of the elliptically mouthed, stepped mid-range speaker that provides an acoustic choke to the bell resonance effect and increases radial dispersion of the sound by providing a series of elliptical steps that each become a horn mouth for a certain frequency associated therewith, thereby eliminating bell resonance and increasing mid-range horn efficiency and dispersion.

A final problem encountered in prior art devices and solved by the device according to the instant application is the matching of the high frequency response to the rest of the components so that the high frequencies are not overpowered and muted by the over amplification of the lower frequency ranges. This problem is solved by placing the tweeters inside the mid-bass horn in a precise relationship with the mid-bass driver thereby taking advantage of the sound dispersions surfaces contained therein and providing a means to easily match the power afforded to the various frequency ranges.

The prior art of which applicant is aware that would appear to be germane to the patent process is as follows U.S. Pat. Nos.: 2,808,121, Goettner 2,975,852, Chave 3,729,061, Tamura 4,119,799, Merlino 4,138,594, Klipsch 4,325,454 Humphrey.

Of the prior art citations, the patent to Chave is of interest since he teaches the use of loading a folded bass horn from the diaphram of a driver which also loads an acoustic enclosure from the front. The device according to the instant application is distinguished in that it provides a series of compression chambers and compression baffles which facilitate the excitement of the column air contained within the bass horn chamber. Furthermore, the patent to Chave exhibits a meandering convoluted path for the sound to travel through the folded horn section of the bass speaker enclosures which results in acoustical muting of the sound rather than an acoustical boost which is the effect of the device according to the instant application.

The patents to Klipsch and Tamura are of interest since they both teach the use of redirecting the lower frequencies through a cabinet enclosure to invert the phase and enhance the resultant sound. However, neither of the aformentioned citations provide baffle plates to define acoustic compression chambers to boost lower frequency resonance. Furthermore, the interior curved surfaces of the folded base horn enclosure in the instant invention provide advantages when trying to excite the column of air contained thereon.

Further distinguishing characteristics of the instant invention will become apparent when considering the detailed specifications to follow.

OBJECTS AND SUMMARY OF THE INVENTION

A primary object of the present invention is to provide a loudspeaker system in which the components are more readily tuned one to the other, because of the configuration provided by the speaker enclosures themselves.

It is a further object of the present invention to provide a loudspeaker system which provides a high fidelity sound for live music and recorded music.

It is a still further object of the present invention to provide a loudspeaker system which is particularly well suited for the reproduction or transmission of the human voice, thereby overcoming the current problem with the poor quality of public address systems presently being used.

It is another object of the present invention to provide a loudspeaker system which can enhance bass resonance response by taking advantage of the rear face of the woofer diaphram to drive the lower bass horn which boosts lower frequency response without the requirement of additional amplification or larger, heavier diaphrams.

It is a still further object of the present invention to provide a loudspeaker system in which the tweeters take advantage of the mid-bass horn enclosure to provide recovery of high frequency defraction which ordinarily causes the tweeters to lose coherence.

It is a still further object of the present invention to provide a loudspeaker system in which the mid-range horn is a stepped elliptical transformer to provide a wider horizontal sound dispersion pattern and simultaneously provide an acoustic choke to prevent the occurence of bell resonance, or the harmonic ringing of horns with smooth shapes.

It is still another object of the present invention to provide a loudspeaker system in which the cutoff frequency of the front loading mid-base horn is compatible with the upper frequency limit of the rear loading horn to produce a smooth acoustic cross-over due to the utilization of both sides of the woofer diaphram.

It is a still another object of the present invention to provide a loudspeaker system in which a single woofer diaphram is used to drive both the mid-bass and bass horns.

It is a still further object of the present invention to provide a loudspeaker system which ensures that the acoustic impedence seen by the woofer diaphram is of the same nature for both front and rear loading.

It is still another object of the present invention to provide a loudspeaker system that improves efficiency and dispersion so that audience coverage is maximized and power input is minimized.

These and other objects will become manifest when considered in light of the following detailed description taken in conjunction with the accompanying drawings wherein like reference numerals represent like parts throughout the several figures found therein.

DETAILED DESCRIPTION OF THE PREFERRED EMBODIMENT

Figure 1:
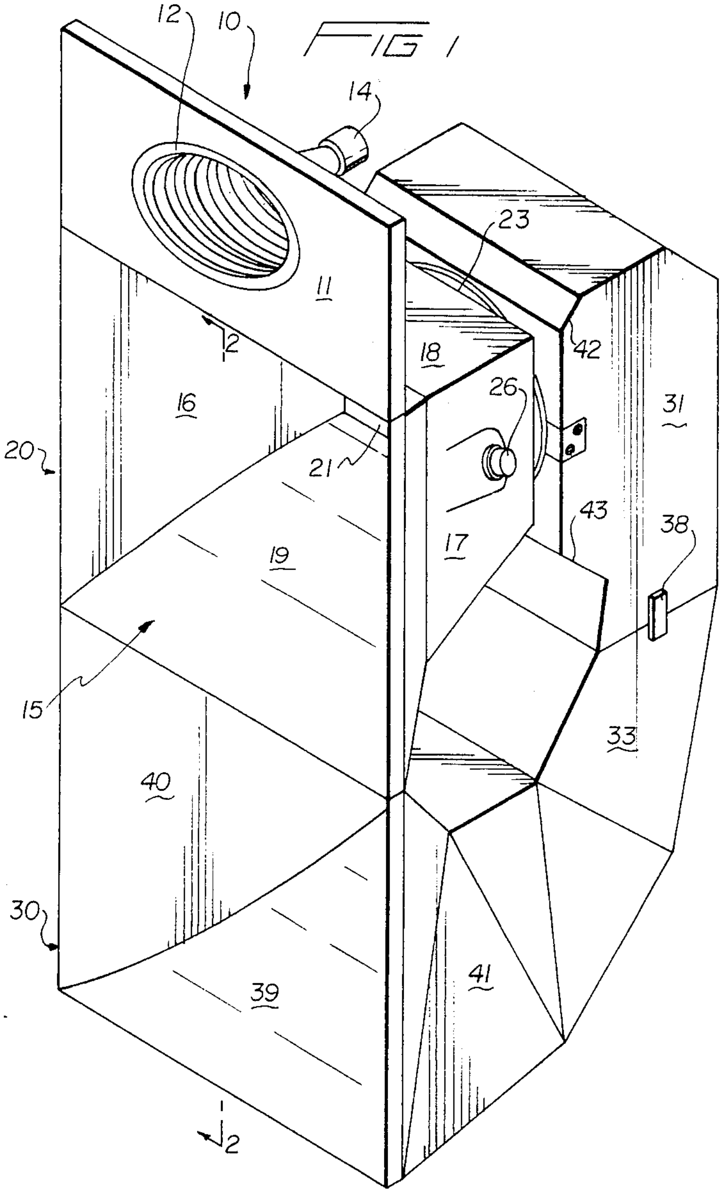
FIG. 1 is a perspective view of the completely assembled speaker system.
Figure 4:
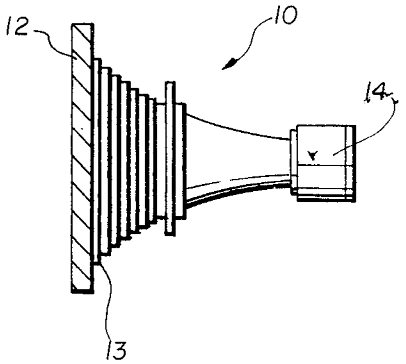
FIG. 4 is a partial sectional of the elliptical horn transformer showing the stepped mouths integral thereto.

Referring now to FIG. 1, reference numeral 10 is directed to the mid-range acoustic transformer which has a front wall 11 with a centrally disposed, elliptically flared horn 12 which has a series of successive steps 13 creating a series of successively greater area acoustical mouths as is also shown in FIG. 4. Each step 13 is formed at 90° to the previous step and is likewise formed at 90° to a center line of the horn 12 itself. The elliptical steps 13 are disposed such that the longer axis is horizontal and the shorter axis is vertical. The steps on a horizontal plane follow an exponential curve as they radiate forwardly for the final flare of the horn 10. Similarly, the steps on a vertical plane radiate forwardly on a hypex curve with each step flaring out to the final step of the mouth of horn 12. These two flares in combination enhance the horizontal dispersion of the sound eminating from the horn 12. The problem of bell resonance associated with single frequency feedback reentering the speaker is alleviated by the steps 13 which create an acoustical choke. Each successive step 13 forms an acoustical mouth, each successive mouth responding to a different mid-range frequency reflected therefrom. The horn 10 is driven by a commercially available and compatible driver 14 which is fitted to the throat portion of the horn 12, as shown in FIG. 4.

Figure 2:
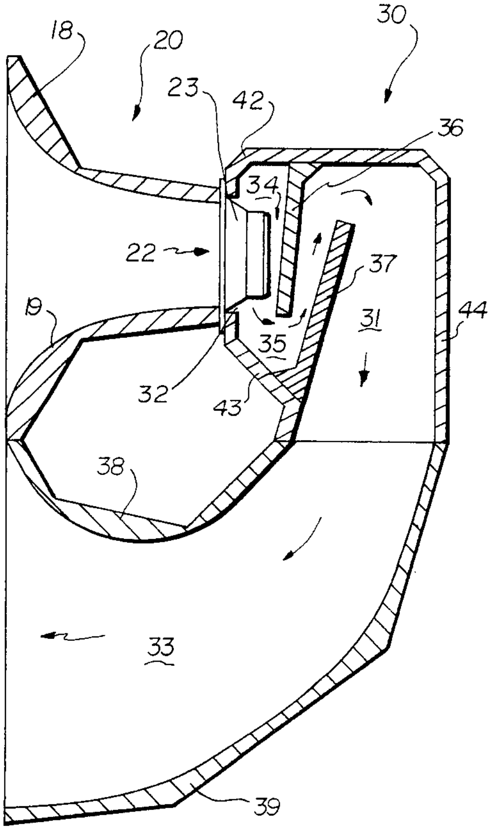
FIG. 2 is a sectional view of that which is shown in FIG. 1 taken along lines 2—2.
Figure 3:
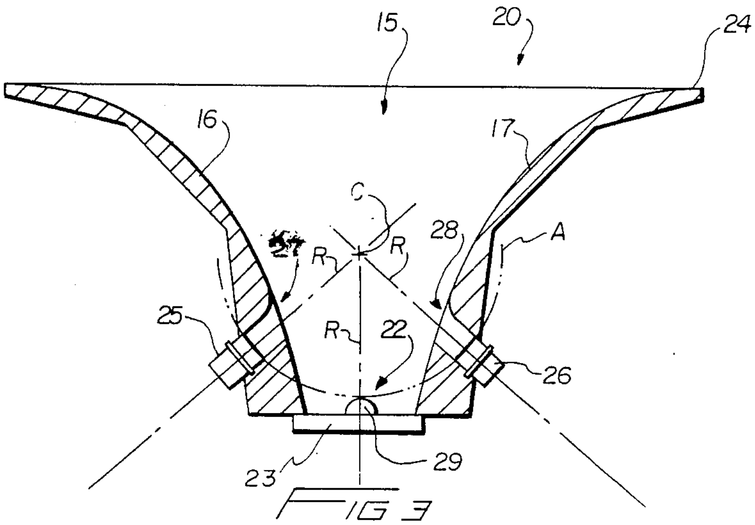
FIG. 3 is a top sectional view of the mid-bass speaker showing the two tweeters

The mid-bass horn generally referred to by reference 20, has an open front mouth 15, FIG. 3, two sidewalls 16 and 17 top wall 18 and a bottom wall 19, all of the walls flaring inwardly and tapering to a rear wall 21 which has opening 22, the horn throat, adapted to overly and receive a commercially available and compatible woofer 23 secured in the opening 22 and directed outwardly toward the mouth 15 of the mid-bass horn 20. The opening 22 is slightly smaller than the diameter of the woofer 23 which creates a controlled impedence equal to the impedence encountered in rear loading, thus positive and negative impedence are equalized. As best shown in FIG. 3, the sidewalls are flared outwardly from the opening 22 in an exponential curve to the outside edge 24 which is substantially 90° from a center line axis of the mid-bass horn 20. This flaring maximizes dispersion of the sound eminating from the horn. This can be readily observed in FIG. 3 where the inside surfaces of the sidewall 16 and 17 are a smooth curve, whereas the exterior portions of the sidewalls 16 and 17 are an approximation of that curve. The sidewalls 16 and 17 have two passages 27 and 28 adapted to receive two tweeters 25 and 26, the tweeters being aimed substantially forwardly and positioned to take advantage of the beneficial shape of the mid-bass horn 20 itself and to allow for the easy balancing of the components on a power-amplification basis. The tweeters 25, 26 are in a precise relationship with the dome 29 on the woofer 23. Reference line A FIG. 3, describes a circular arc which passes through the center of the tweeters 25, 26 and the dome 29 of the woofer 23. Thus the distance R from the center point C of the reference arc A is the same for each component. This relationship ensures time alignment of the tweeters, thus the sound eminating from the tweeters 25, 26 and the woofer 23 reaches the audience simultaneously and in phase, i.e. time alignment. The aiming of the tweeters 25 and 26 allow for the maximum dispersion of high frequency waves. As best shown in FIG. 2, the top and bottom walls 18 and 19 of the mid-bass horn 20 are similarly flared except that these both follow a hypex curve instead of a exponential curve relationship. Once again, this flaring aids in sound dispersions.

The low bass horn generally referred to by reference numeral 30, has an upper section 31 which communicates with the rear of the mid-bass horn 20 and is formed to receive the rear of the woofer 23 through an opening 32 in the front face of the upper section 31 of the throat of low bass horn 30. The lower section 33 (horn mouth) of the low bass horn 30 is joined to the upper section (horn throat) by means of a clasp 38, the two together forming one contiguous folded horn. Once again, the interior of the lower bass horn section 33 is a curved surface approximating the curve found in a base tuba. The mouth of the lower bass horn section assists in creating an acoustical boost for the lower bass frequencies. As is shown in FIG. 1 taken in combination with FIG. 2, the exterior walls of the lower bass horn section 33 are approximations of the smooth interior surfaces of the walls defining the lower bass horn section 33. The top and bottom walls 38 and 39 in FIG. 2 have three exterior facets which help to define the interior curve of said walls. Similarly, the sidewalls 40 and 41 have a series of facets which define the smooth interior surfaces created therefrom. The walls and structures associated with all three acoustic horn 10, 20, and 30 are constructed from molded fiberglass or the like, resulting in the multifaceted exterior surfaces and the smooth acoustically pleasing interior surfaces. It should also be noted that the molds forming the horns may also be designed to produce smooth, rounded exterior surfaces as well as the multifaceted exterior walls shown in the present embodiment.

The upper section 31 of the low frequency bass horn 30 receives the back of the woofer 23 as previously noted. The woofer diaphram is used to rearwardly load the entire low frequency bass horn 30, thus a single woofer diaphram of the woofer 23 is loaded on both a front side and a rear side, thereby reducing acoustic imedence and increasing the output and balance of low frequency sound. The sound path of the folded horn as shown by the directional arrows, effecting an acoustical boost is produced to increase low frequency response.

A first acoustical horn section 34 is defined by a truncated upper wall 42 of the upper section 31 and the baffle 36 depending downwardly and inwardly therefrom. The first acoustical horn section 34 communicates with a second acoustical horn section 35 defined by a lower side wall 43 and the upwardly extending baffle member 37. These acoustical horn section 34 and 35 in combination create a folded tapered space between the woofer 23 and the lower folded horn section 33 thereby creating acceleration of the sound waves therethrough which more quickly excites the column of air contained in the horn 30. The baffles 36 and 37 also act as a crossover filter by eliminating frequencies above 150 HZ which will not pass along the path indicated by the directional arrows FIG. 2. The baffles 36 and 37 are constructed from audio absorbant material which aids in preventing any wrongly defracted sound waves from returning and impeding the oscillation of the diaphram in the woofer 23, the sound travels through the folds created by the baffle to the greater expanse of the upper section 31 defined by the rear wall 44 and then downwardly into the larger cavity created by the lower section 33 of the low frequency bass horn 30. This convaluted path ensures that the sound eminating from the two speaker horns 20 and 30 will be in phase when projected outwardly from these mouths of the two horns which are directed coplanarly. Similarly, the mid-range horn 10 is aimed in the same direction. The lower cutoff frequency of the mid-bass horn 20 coincide with the upper frequency response of the low bass horn 30 so that in conjunction they both operate from the same woofer 23, the result being a smooth transition and an acoustic coupling to the two horns without the necessity of added amplification or a larger and stiffer type woofer diaphram which results in slow woofer response and a lack of linear phase clarity among the various components.

In use and operation the horns 10, 20 and 30 are acoustically coupled as shown in FIG. 1 and similarly directed in a coplanar fashion so that a full range of frequency response is targeted outwardly. Each of the components is tuned to one another and neither mutes the other due to the acoustical choking effect created by the elliptical steps 13 of the mid-range horn 10, the placement of the tweeters 26 and 27 within the mid-bass horn 20, and the front and rear loading of the woofer 23 thereby eliminating the need for additional, slow responding components which often dominate the resultant sound reproduction. The result is a speaker system high in fidelity through the entire audible frequency ranges created by the various, integrated components.

Having thus described the preferred embodiment of the invention, it should be understood that numerous structural modifications and adaptations may be resorted to without departing from the spirit of the invention.

I claim:

1. A loudspeaker system comprising, in combination:

a mid-range acoustic transformer including a flared, stepped elliptical horn with a mid-range driver therein;

a woofer having a diaphragm;

a mid-bass acoustic horn mounted below said mid-range acoustic transformer, said mid-range bass acoustic horn having said woofer with said diaphragm disposed on a rear wall thereof to provide said diaphragm with a positive operational impedance encountered by front loading, said mid-bass acoustic horn having at least two opposing curved walls;

a low-bass acoustic horn positioned directly beneath said mid-bass acoustic horn and having a folded horn interior section which communicates with rear of said woofer to provide said diaphragm with a negative operational impedance encountered by rear loading, a balance being provided between said positive and negative operational impedances, a lower frequency response being provided to said low-bass acoustic horn by said diaphragm of said woofer; and a pair of tweeters disposed on said opposing curved walls of said mid-bass acoustic horn, which curved walls disperse high frequency waves from said tweeters.

2. The loudspeaker system according to claim 1, wherein said mid-range acoustic transformer comprises an elliptical stepped horn having a plurality of elliptical steps, each of said steps being substantially at 90° angles with respect to each successive step so that a series of horn mouths are formed, each successive said mouth being greater in area and responding to and radiating successively greater pass band frequency wave lengths, whereby sound dispersion is greatly increased and an acoustic choke is formed to impede reentry of wave lengths which might be diffracted back into said elliptical horn.

3. The loudspeaker system according to claim 2, wherein said mid-range transformer and said elliptical steps associated therewith form said gradually increasing mouths, said mouths being horizontally oriented and following an exponentially increasing horizontal flare and a vertical flare, all of said steps being at a 90° angle from the axis of a center line of the horns.

4. The loudspeaker system according to claim 1, wherein said mid-range transformer including said stepped horn is mounted directly above said mid-bass acoustic horn and is aimed in the same direction.

5. The loudspeaker system according to claim 4, wherein said mid-bass acoustic horn has an open front of substantially larger area than said rear wall which has an opening therein adapted to receive said woofer and further having top and bottom walls connecting said rear wall two said open front, said top and bottom walls following a flare curve forwardly, and wherein said at least two opposing curved walls are sidewalls connecting said front opening to said rear wall, said sidewalls following an exponential flare curve forwardly.

6. The loudspeaker system according to claim 5, wherein said mid-bass acoustic horn has in center of rear portions of each of said sidewalls a portal adapted to receive one of said tweeters, each of said tweeters being positioned in respective said portals and being aimed substantially forwardly and inwardly, said tweeters and said woofer being in arcuate relationship equidistant from a center point within said mid-bass acoustic horn thereby establishing a linear time alignment of different frequencies of sound coming from said tweeters and said woofer.

7. The loudspeaker system according to claim 6, wherein said woofer and said opening in said rear wall of said mid-bass acoustic horn are dimentioned to provide the balanced positive and negative operational impedences encountered by said diaphram of said woofer.

8. The loudspeaker system according to claim 7, wherein said sidewalls and said top and bottom walls within said mid-bass acoustic horn and walls of said bass acoustic horn have substantially smooth interior surfaces.

9. A loudspeaker system in which a bass transformer approximates a folded low-bass horn, the system comprising, in combination:

a woofer having a diaphragm;

a mid-bass transformer including a mid bass horn having an open front and providing said diaphragm with a positive operational impedance encountered by front loading;

an upper section of said folded low-bass horn communicating with rear of said woofer and providing said diaphragm with a negative operational impedence encountered by rear loading, a balance being provided between said positive and negative impedences, a lower frequency response being provided to said low-bass horn by said diaphragm of said woofer, said upper section having first and second acoustical portions through which low frequency sound waves generated by rear of said diaphragm in said woofer travel a convoluted path through said portions and are enhanced, said first acoustic portion being defined by baffle means depending from a wall of said upper section and defining dead air space between the rear of said woofer and said baffle means, whereby low frequency sound waves from said woofer excite the dead air space and are repercussed and boosted by said first acoustical portion and directed into said second acoustical portion; and a lower section of said folded low-bass horn joined to and communicating with said upper section and gradually expanding downwardly and forwardly therefrom, terminating in an acoustic mouth situated directly beneath and coplanar with said open front in said mid-bass acoustic horn.

10. The loudspeaker system according to claim 9, wherein said baffle means comprises first baffle means depending from a top wall of said upper section and directed downwardly and slightly forwardly forming a tapered, necked down dead air space between the rear of said woofer and said first baffle means, whereby low frequency sound waves from said woofer excite the dead air space and are repercussed and boosted by said first acoustical portion and directed downwardly into said second acoustical portion.

11. The loudspeaker system according to claim 10, wherein said second acoustical portion is defined by a downwardly and rearwardly directed sidewall of said upper section and a second baffle means extending uperwardly and rearwardly from said sidewall of said upper section, whereby sound waves directed downwardly from said first acoustical portion are boosted and repercussed upwardly from said second acoustical portion thereafter reflecting off of a top wall of said upper section, being then directed downwardly into said lower section by a rear wall of said upper section and said second baffle means.

12. The loudspeaker system according to claim 11, wherein said lower section has smooth curved inner surfaces contiguous with inner surfaces of said upper section to direct sound waves toward said acoustic mouth of said lower section.

13. The loudspeaker system according to claim 12, wherein said first and said second baffle means are formed from panels of an acoustically absorbant material and completely transverse said upper section and filter out frequences above about 150 HZ.

14. The loudspeaker system according to claim 13, wherein said second baffle means has a thickened base portion with an upwardly and forwardly directed face to reflect sound waves upwardly from said second acoustic portion towards the rear surface of said first baffle means, said first baffle means having a thickened base portion forming a rearwardly and downwardly directed face to reflect sound waves downwardly towards said lower section.

15. The loudspeaker system according to claim 14, wherein said upper section has truncated upper corners forming downwardly directed inner faces to aid in transition of sound waves from said woofer to said acoustical mouth of said lower section.

* * * * *